United States Patent
Itoh et al.

(10) Patent No.: US 7,148,091 B2
(45) Date of Patent: Dec. 12, 2006

(54) METHOD OF MANUFACTURING THIN FILM TRANSISTOR

(75) Inventors: Yasuyoshi Itoh, Chiyoda-ku (JP);
Takeshi Kubota, Kikuchi-gun (JP);
Toru Takeguchi, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/196,574

(22) Filed: Aug. 4, 2005

(65) Prior Publication Data

US 2006/0030086 A1 Feb. 9, 2006

(30) Foreign Application Priority Data

Aug. 6, 2004 (JP) .............. 2004-230825

(51) Int. Cl.
*H01L 21/00* (2006.01)
*H01L 21/336* (2006.01)
(52) U.S. Cl. .............. 438/160; 438/308; 438/378; 438/473
(58) Field of Classification Search ........ 438/160, 438/308, 378, 473, 554; 257/213, 288
See application file for complete search history.

(56) References Cited

U.S. PATENT DOCUMENTS 6,380,044 B1 * 4/2002 Talwar et al. .............. 438/308

FOREIGN PATENT DOCUMENTS

| JP | 5-121436 | 5/1993 |
| JP | 10-154813 | 6/1998 |
| JP | 2000-91591 | 3/2000 |
| JP | 2000-269133 | 9/2000 |
| JP | 2000-349297 | 12/2000 |
| JP | 2002-367904 | 12/2002 |

OTHER PUBLICATIONS

H. Nakagawa et al., "Reliability of Low Temperature Poly-Si Gold (Gate-Overlapped LDD) Structure TFTs", AM-LCD, 2002, 167-170.

* cited by examiner

*Primary Examiner*—Hsien-Ming Lee
(74) *Attorney, Agent, or Firm*—Buchanan Ingersoll & Rooney PC

(57) ABSTRACT

Impurity ions contained in a semiconductor layer are diffused downwardly from a gate electrode by irradiating laser light from the back surface of a transparent substrate after source-drain regions are formed. Thus, a GOLD structure is formed. Consequently, the GOLD structure is formed by performing a smaller number of processes. Also, variation in characteristics can be suppressed by preventing occurrence of asymmetry between left and right LDD regions.

5 Claims, 6 Drawing Sheets

METHOD OF MANUFACTURING THIN FILM TRANSISTOR

BACKGROUND OF THE INVENTION

1. Field of the Invention

The present invention relates to a manufacturing method of a thin film transistor having a Gate-Overlapped-LDD (GOLD) structure.

2. Description of the Related Art

To improve reliability, a thin film transistor employs a GOLD structure. This structure is formed as follows. That is, first, low dose amount regions (LDD regions) are formed after a gate electrode is once formed. Thereafter, a gate electrode is formed again, so that source/drain regions are formed. Thus, the LDD regions are formed under the gate electrode by performing a photoengraving process twice for forming a gate electrode, as disclosed in JP-A-2000-91591 and JP-A-2000-349297.

According to the aforementioned method of manufacturing the GOLD structure, the gate electrode is formed by performing the photoengraving process twice. Thus, the aforementioned method has a problem that the number of processes increases. Also, because the gate electrode is formed by performing the photoengraving process twice, it is highly likely that asymmetry occurs between the left and right LDD regions due to the accuracy of overlapping between the first formed gate electrode and the second formed gate electrode. Thus, the aforementioned method has a problem that it is difficult to suppress variation in characteristics.

SUMMARY OF THE INVENTION

The invention is accomplished to solve the aforementioned problems. Accordingly, an object of the invention is to provide a manufacturing method for a thin film transistor (TFT) enabled to form a gate electrode of a GOLD structure by performing a smaller number of processes and also enabled to prevent occurrence of asymmetry between left and right LDD regions to thereby suppress variation in characteristics.

According to the invention, there is provided a method of manufacturing a thin film transistor, which includes the step of forming a base film, in which one or plural kinds of insulating films are stacked, on a transparent substrate, the step of forming a semiconductor layer on the base film, the step of forming a gate insulating film on the semiconductor layer, the step of forming a gate electrode on the gate insulating film, the step of forming source/drain regions by ion-implanting impurity ions into the semiconductor layer, and the step of diffusing the impurity ions, which are contained in the semiconductor layer, downwardly from the gate electrode by irradiating laser light, which has a wavelength ranging from 370 nm to 710 nm, from a back surface of the transparent substrate.

According to the invention, LDD regions are formed in a self-aligned manner. Thus, there is no necessity for performing photoengraving twice so as to form a gate electrode. Consequently, the number of processes can be reduced. Also, the left-right balance of a TFT does not depend upon the overlapping precision of photoengraving. Thus, the TFT can be formed bilaterally symmetrically. Consequently, variation in characteristics of the TFT can be suppressed. Also, because the gate electrode is not formed twice, the height of a step due to the gate electrode can be reduced.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

First Embodiment

Figure 1A:
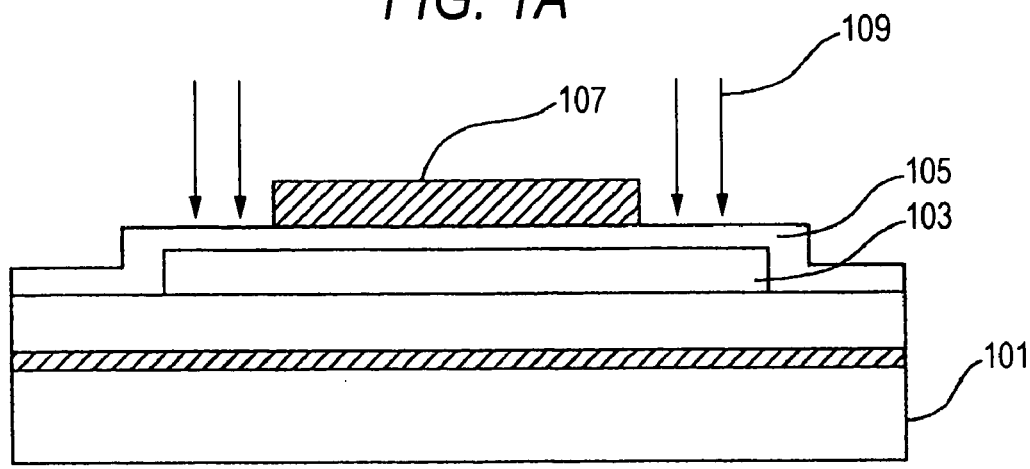
FIGS. 1A to 1C are schematic views illustrating a manufacturing process of a thin film transistor according to a first embodiment of the invention.
Figure 1B:
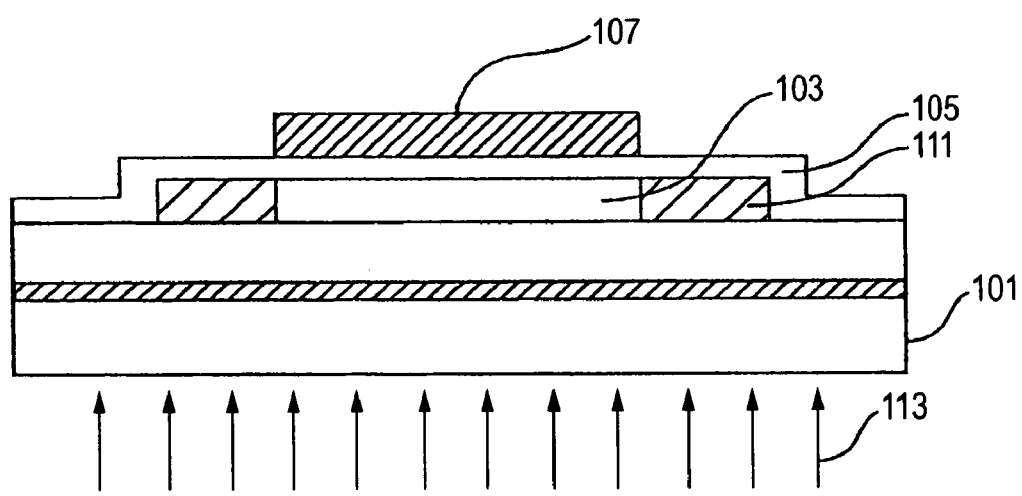
Figure 1C:
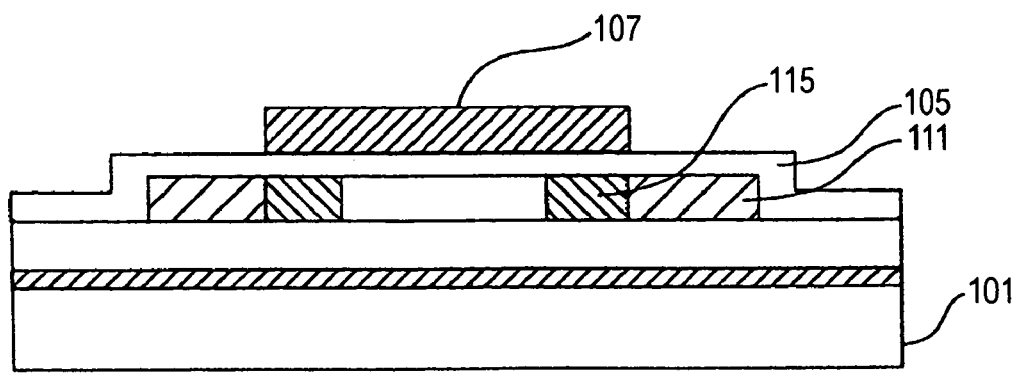

FIGS. 1A to 1C are schematic views illustrating a manufacturing process of a thin film transistor according to a first embodiment of the invention. Incidentally, in explanatory views respectively illustrating embodiments described in the following description, same or corresponding parts are designated by same reference characters. Thus, the description of such parts is omitted.

Referring to FIG. 1A, first, a base film is formed on a glass substrate 101. Subsequently, a polysilicon layer (corresponding to the semiconductor layer) 103 is formed on the base film. Then, the polysilicon layer 103 is patterned. A gate insulating film 105 and a gate electrode 107 are formed on the polysilicon layer 103. Then, ion-implantation 109 is performed so as to form source/drain regions in the polysilicon layer 103. Source/drain regions may be formed by the ion-implantation 109 before the gate insulating film 105 is formed. The crystal structure of the polysilicon layer 103 is amorphized by the ion-implantation 109.

Referring to FIG. 1B, source/drain regions 111 are formed in the polysilicon layer 103 by the ion-implantation. Thereafter, for example, frequency-doubled YAG laser light 113 having a wavelength, λ ranging from 370 nm to 710 nm is irradiated from the back surface of the glass substrate 101. At the irradiation of laser light having this frequency, the amorphous silicon region is larger in energy absorption coefficient than the polysilicon region. Thus, heat can effectively be added to the source/drain regions of the amorphous silicon layer by the ion-implantation 109.

Referring to FIG. 1C, impurities are horizontally diffused from the source/drain regions 111 by irradiating visible laser light 113, such as a frequency-doubled YAG laser, from the back surface of the glass substrate 101. Thus, LDD regions 115 are formed.

As described above, according to the first embodiment of the invention, the LDD regions are formed in a self-aligned manner. Thus, there is no need for performing photoengraving twice so as to form the gate electrode. Consequently, the number of processes can be reduced. Also, the left-right balance of a TFT does not depend upon the overlapping precision of photoengraving. Thus, the TFT can be formed bilaterally symmetrically. Consequently, variation in characteristics of the TFT can be suppressed. Also, because of the facts that the gate electrode is not formed twice and that there is no necessity for forming a new gate electrode material, the height of a step due to the gate electrode can be reduced.

Moreover, at irradiation of laser light, such as frequency-doubled YAG laser light, of a wavelength λ ranging from 370 nm to 710 nm from the back surface of the glass substrate 101, the amorphous silicon region is larger in energy absorption coefficient than the polysilicon region. Thus, the crystal structure of the layer is amorphized by the ion-implantation. Consequently, heat can effectively be added to the neighborhood of each of the source/drain regions by the ion-implantation 109. Incidentally, in this embodiment and other embodiments, a glass substrate is used as the aforementioned substrate. However, other transparent substrates, such as a quartz substrate and a plastic substrate, may be used.

Second Embodiment

In the first embodiment, the polysilicon layer is relatively thin. Further, the source/drain regions are formed in a region extending from the top surface to the bottom surface of a longitudinal section of the polysilicon layer. In contrast, in a second embodiment, the polysilicon layer is relatively thick. Furthermore, the source/drain regions are formed in such a way as to be sufficiently thin.

Figure 2A:
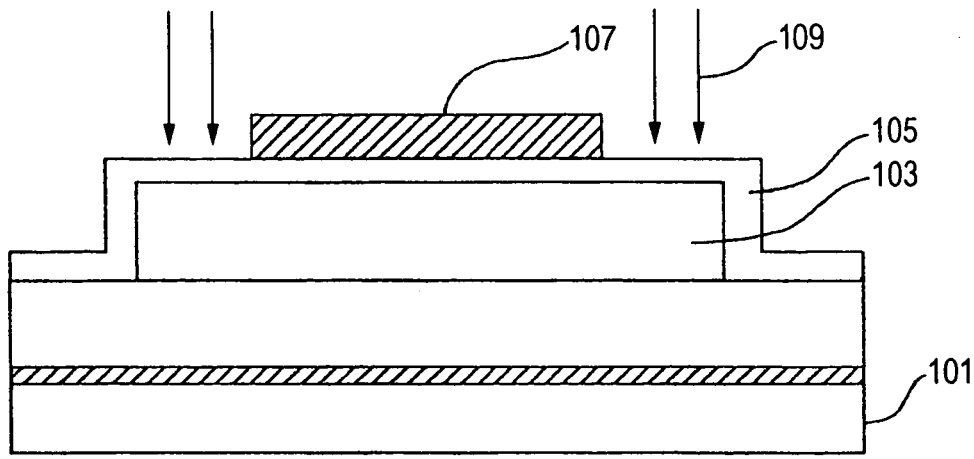
FIGS. 2A to 2C are schematic views illustrating a manufacturing process of a thin film transistor according to a second embodiment of the invention.
Figure 2B:
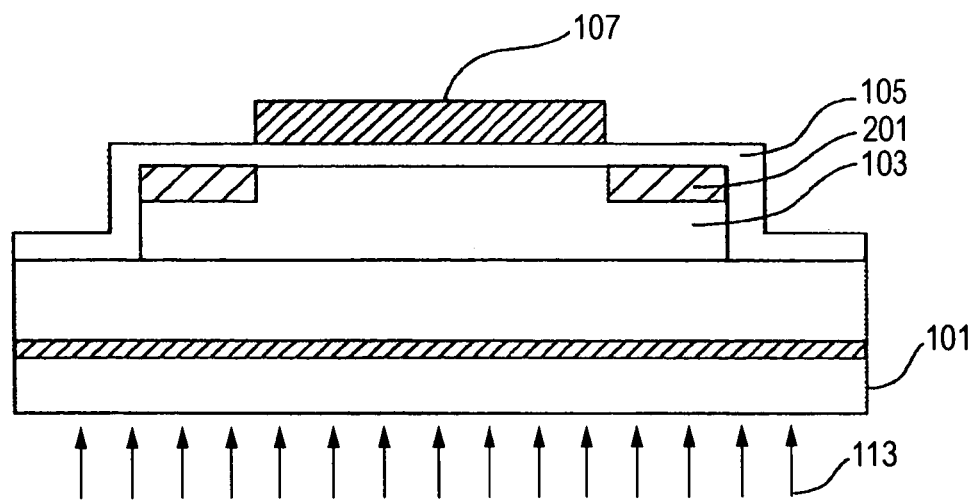
Figure 2C:
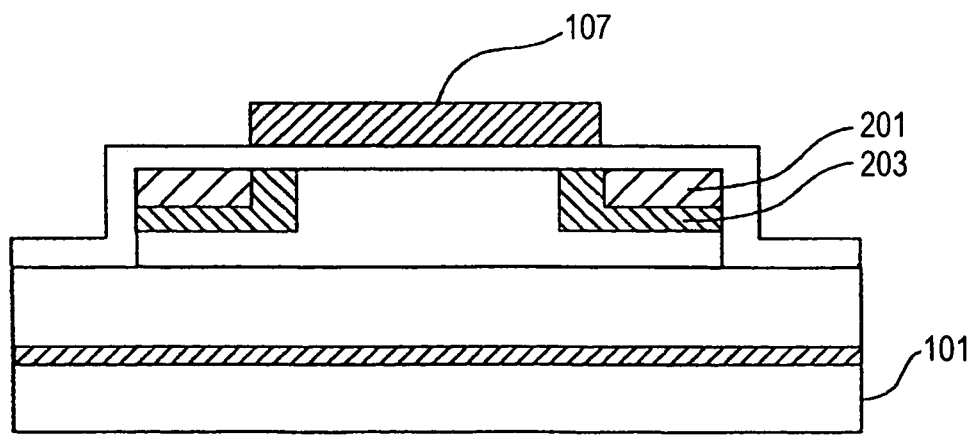

FIGS. 2A to 2C are schematic views illustrating a manufacturing process of a thin film transistor according to the second embodiment of the invention.

Referring to FIG. 2A, similarly to the first embodiment, after a base film is formed on a glass substrate 101, a polysilicon layer 103 is formed on the base film. Then, the polysilicon layer 103 is patterned. Subsequently, a gate insulating film 105 and a gate electrode 107 are formed on the polysilicon layer 103. Then, ion-implantation 109 is performed so as to form source/drain regions in the polysilicon layer 103. Source/drain regions may be formed by the ion-implantation 109 before the gate insulating film 105 is formed. The crystal structure of the polysilicon layer 103 is amorphized by the ion-implantation 109.

Referring to FIG. 2B, source/drain regions 201 are formed in the polysilicon layer 103 by the ion-implantation. At that time, in a case where the polysilicon layer 103 is relatively thick, the source/drain regions 201 do not reach the bottom surface of a longitudinal section of the polysilicon layer 103. Thereafter, for example, visible laser light 113, such as a frequency-doubled YAG laser light, is irradiated from the back surface of the glass substrate 101. Similarly to the first embodiment, at the irradiation of the frequency-doubled YAG laser light, the amorphous silicon region is larger in energy absorption coefficient than the polysilicon region. Thus, heat can effectively be added to the source/drain regions 201 of the amorphous silicon layer by the ion-implantation.

Referring to FIG. 2C, impurities are diffused from the source/drain regions 201 by irradiating visible laser light 113, such as a frequency-doubled YAG laser, from the back surface of the glass substrate 101. Thus, LDD regions 203 are formed.

As described above, according to the second embodiment of the invention, similarly to the first embodiment, the LDD regions are formed in a self-aligned manner. Thus, there is no need for performing photoengraving twice so as to form the gate electrode. Consequently, the number of processes can be reduced. Also, the left-right balance of a TFT does not depend upon the overlapping precision of photoengraving. Thus, the TFT can be formed bilaterally symmetrically. Consequently, variation in characteristics of the TFT can be suppressed. Also, because of the facts that the gate electrode is not formed twice and that there is no necessity for forming a new gate electrode material, the height of a step due to the gate electrode can be reduced.

Moreover, at irradiation of laser light, such as frequency-doubled YAG laser light, from the back surface of the glass substrate 101, the amorphous silicon region is larger in energy absorption coefficient than the polysilicon region. Thus, the crystal structure of the layer is amorphized by the ion-implantation. Consequently, heat can effectively be added to the neighborhood of each of the source/drain regions by the ion-implantation 109 to thereby amorphizing the crystal structure. The reference document JP-A-2000-269133, especially, FIG. 1 thereof clearly shows the difference in laser absorption coefficient between the amorphous layer and the polysilicon layer.

Third Embodiment

In the first and second embodiments, the source/drain regions are formed by implanting one ion specie into the polysilicon layer. In contrast, in a third embodiment, the source/drain layers are formed by implanting plural ion species into the polysilicon layer.

Figure 3A:
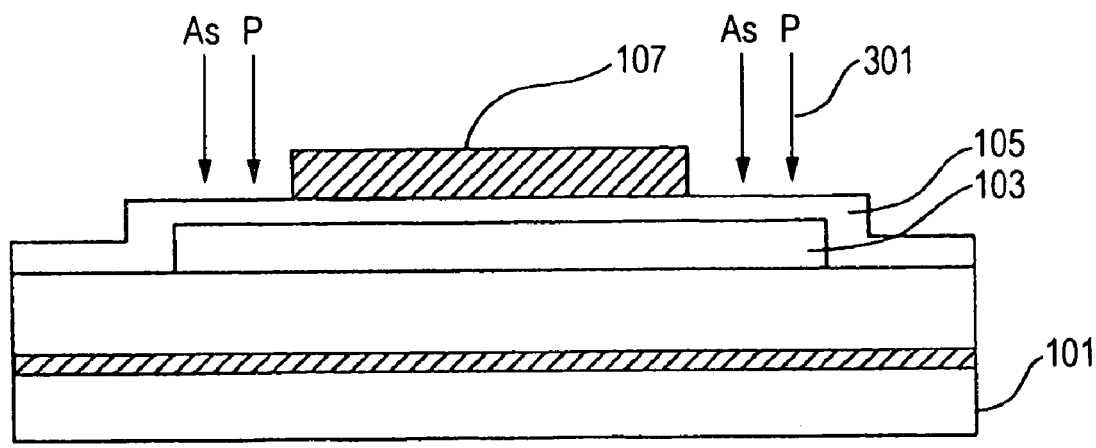
FIGS. 3A and 3B are schematic views illustrating a manufacturing process of a thin film transistor according to a third embodiment of the invention.
Figure 3B:
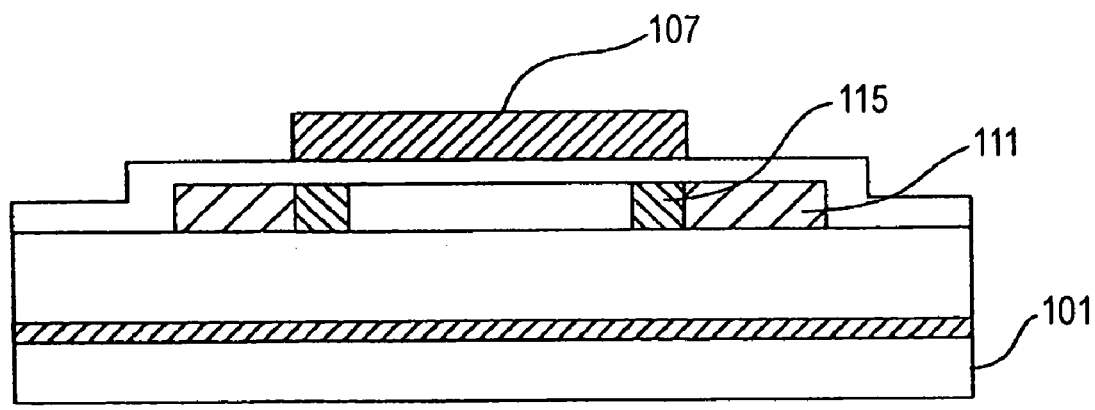

FIGS. 3A and 3B are schematic views illustrating a manufacturing process of a thin film transistor according to the third embodiment of the invention.

Referring to FIG.3A, similarly to the first embodiment, after a base film is formed on a glass substrate 101, a polysilicon layer 103 is formed on the base film. Then, the polysilicon layer 103 is patterned. Subsequently, a gate insulating film 105 and a gate electrode 107 are formed on the polysilicon layer 103. Then, ion-implantation 301 is performed on the polysilicon layer 103 by using plural ion species. Thus, the source/drain regions are formed. For instance, phosphorous ions (P ions) and arsenic ions (As ions) are used as the plural ion species. Source/drain regions may be formed by the ion-implantation 301 before the gate insulating film 105 is formed.

Referring to FIG. 3B, similarly to the first and second embodiments, thereafter, impurities are diffused from the source/drain regions 111 by irradiating visible laser light, such as a frequency-doubled YAG laser, from the back surface of the glass substrate 101. Thus, LDD regions 115 are formed.

As described above, according to the third embodiment of the invention, the plural ion species are used as dopants. Thus, the LDD regions are effectively formed by utilizing the fact that the rate of diffusion of the ions varies dependent upon the kind of the implanted element. In a case where two ion species, for example, P ions and As ions are used, As ions are difficult to diffuse, as compared with P ions. Thus, As ions are liable to remain as dopants in the source/drain regions. Consequently, stable source/drain contact resistance can be obtained. Conversely, P ions are easy to diffuse, as compared with As ions. Thus, the LDD regions can effectively be formed under the gate electrode. Further, when using not only P ions, which are easy to diffuse, but As-ions, As-ions are more easily amorphized at the ion-implantation than P ions. This further facilitates absorption of laser light during laser annealing. Consequently, the diffusion of impurities is effectively achieved.

Fourth Embodiment

In this embodiment, at the ion-implantation into the polysilicon layer, obliquely rotating implantation is performed. Thus, also an impurity region is intentionally formed under the gate electrode.

Figure 4A:
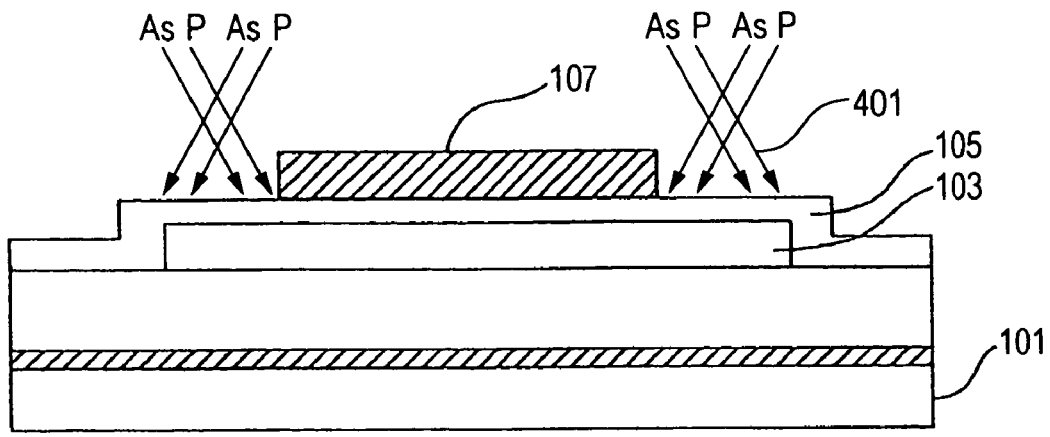
FIGS. 4A to 4C are schematic views illustrating a manufacturing process of a thin film transistor according to a fourth embodiment of the invention.
Figure 4B:
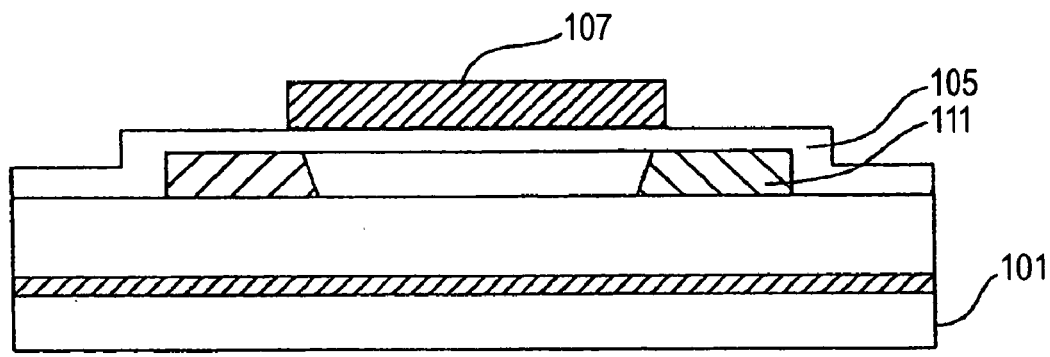
Figure 4C:
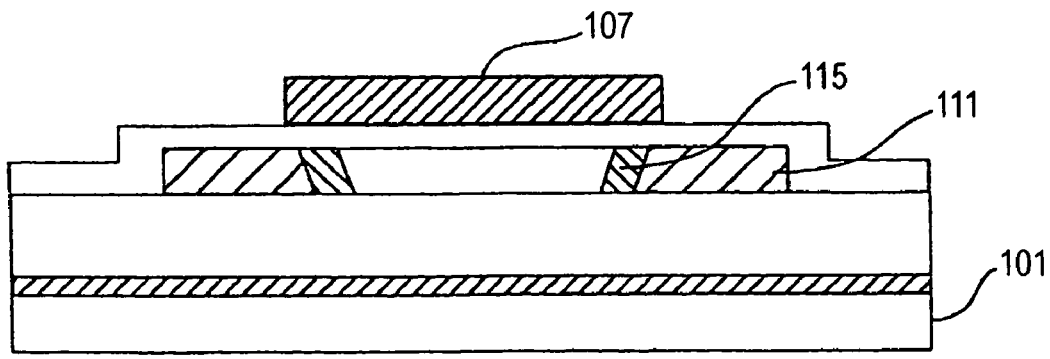

FIGS. 4A to 4C are schematic views illustrating a manufacturing process of a thin film transistor according to a fourth embodiment of the invention.

Referring to FIG. 4A, similarly to the first embodiment, after a base film is formed on a glass substrate 101, a polysilicon layer 103 is formed on the base film. Then, the polysilicon layer 103 is patterned. Subsequently, a gate insulating film 105 and a gate electrode 107 are formed on the polysilicon layer 103. Then, ion-implantation 401 is performed on the polysilicon layer 103 by using plural ion species. Thus, the source/drain regions are formed. For example, phosphorous ions (P ions) and arsenic ions (As ions) are used as the plural ion species. Source/drain regions may be formed by the ion-implantation 401 before the gate insulating film 105 is formed. In this case, a dummy gate electrode is preliminarily formed by using a photoresist. At this ion-implantation 401, oblique implantation for implanting ions from a direction inclined by a predetermined angle with respect to a direction normal to the substrate is performed. Moreover, this implantation is performed by simultaneously rotating the substrate.

Referring to FIG. 4B, source/drain regions 111 can be preliminarily formed under a gate electrode 107 by performing the obliquely rotating implantation, that is, performing the ion-implantation 401 from an oblique direction while the substrate is rotated.

Referring to FIG. 4C, similarly to the first to third embodiments, thereafter, impurities are diffused from the source/drain regions 111 by irradiating visible laser light, such as a frequency-doubled YAG laser, from the back surface of the glass substrate 101. Thus, LDD regions 115 are formed.

As described above, according to the fourth embodiment of the invention, the obliquely rotating implantation is employed as the implantation of ions serving as dopants. Thus, source/drain regions are also formed under the gate electrode. LDD regions can be formed in a more inner part under the gate electrode. Also, because the source/drain regions are formed under the gate electrode, the formation of the LDD regions can be more reliably achieved than that of the LDD regions by utilizing diffusion.

Fifth Embodiment

In the first and second embodiments, LDD regions are formed under the gate electrode by irradiating laser light from the back surface of the substrate after the source/drain regions are formed. In contrast, in a fifth embodiment, laser annealing is performed from above by irradiating laser light obliquely from above the substrate.

Figure 5A:
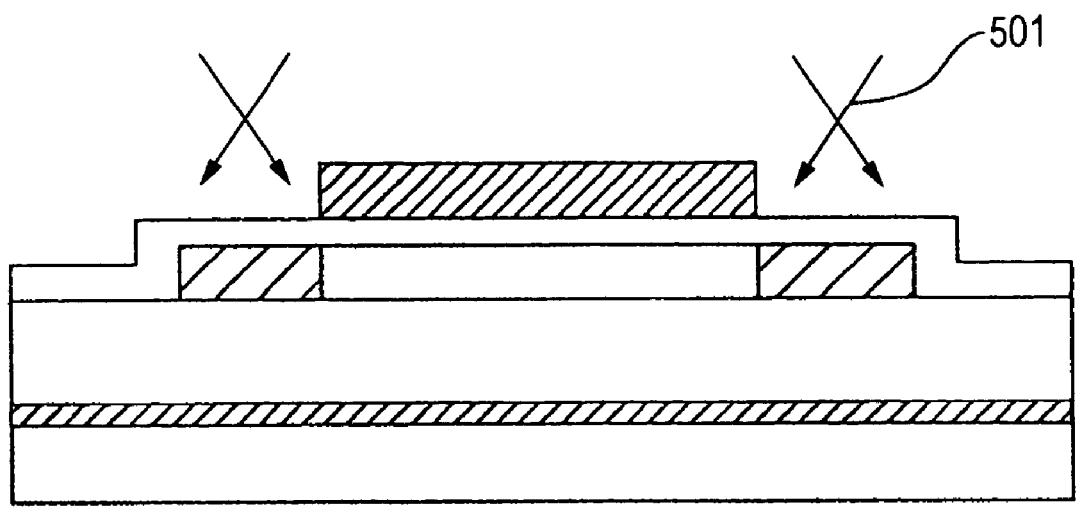
FIGS. 5A and 5B are schematic views illustrating a manufacturing process of a thin film transistor according to a fifth embodiment of the invention.
Figure 5B:
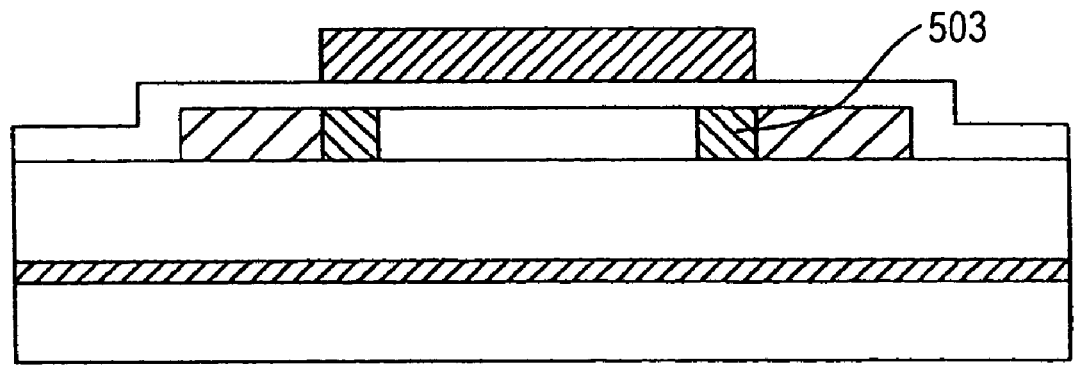

FIGS. 5A and 5B are schematic views illustrating a manufacturing process of a thin film transistor according to the fifth embodiment of the invention.

Referring to FIG. 5A, similarly to the first embodiment, after a base film is formed on a glass substrate 101, a polysilicon layer 103 is formed on the base film. Then, the polysilicon layer 103 is patterned. Subsequently, a gate insulating film 105 and a gate electrode 107 are formed on the polysilicon layer 103. Then, ion-implantation is performed on the polysilicon layer 103. Thus, the source/drain regions 201 are formed. The ion-implantation may be performed by using plural ion species, similarly to the third embodiment. For instance, phosphorous ions (P ions) and arsenic ions (As ions) are used as the plural ion species. Source/drain regions may be formed by the ion-implantation 301 before the gate insulating film 105 is formed. Thereafter, visible laser light 501, such as a frequency-doubled YAG laser, is irradiated obliquely from above the glass substrate 101. Moreover, this irradiation of laser light 501 is performed by simultaneously rotating the substrate.

Referring to FIG. 5B, thereafter, impurities are diffused from the source/drain regions 111 by irradiating visible laser light, such as a frequency-doubled YAG laser, obliquely from above the glass substrate 101. Thus, LDD regions 503 are formed.

As described above, according to the fifth embodiment of the invention, the LDD regions can effectively be formed by obliquely irradiating laser light after the source/drain regions are formed by the ion-implantation.

Sixth Embodiment

In the fifth embodiment, the LDD regions are formed by obliquely irradiating laser light after the source/drain regions are formed. In contrast, in a sixth embodiment, a transparent film differing from the base film in refractive index is formed in the base film, in addition to the constituents of the fifth embodiment. Thus, part of laser light irradiated from above is reflected by the transparent film. Consequently, the effects of annealing are enhanced.

Figure 6A:
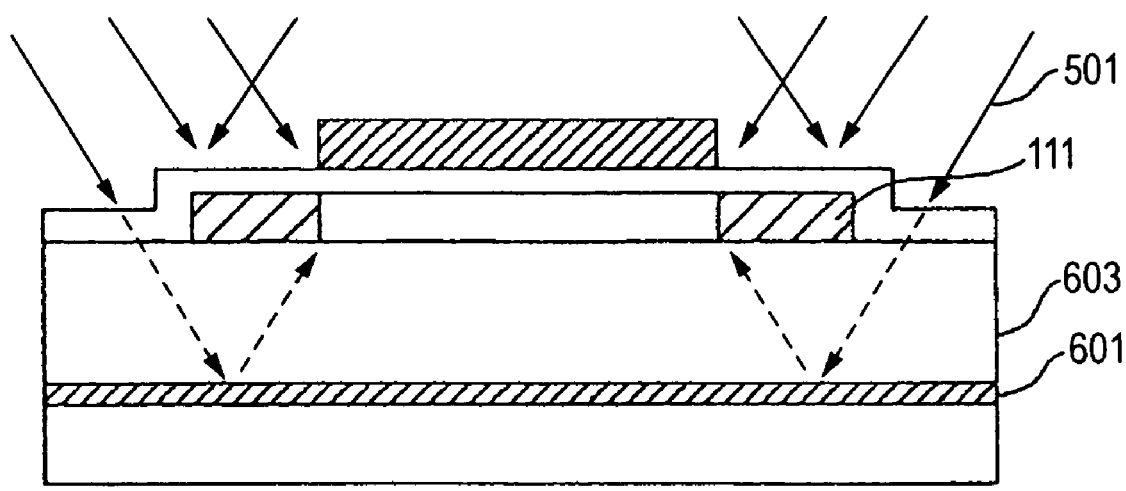
FIGS. 6A and 6B are schematic views illustrating the manufacturing process of a thin film transistor according to a sixth embodiment of the invention.
Figure 6B:
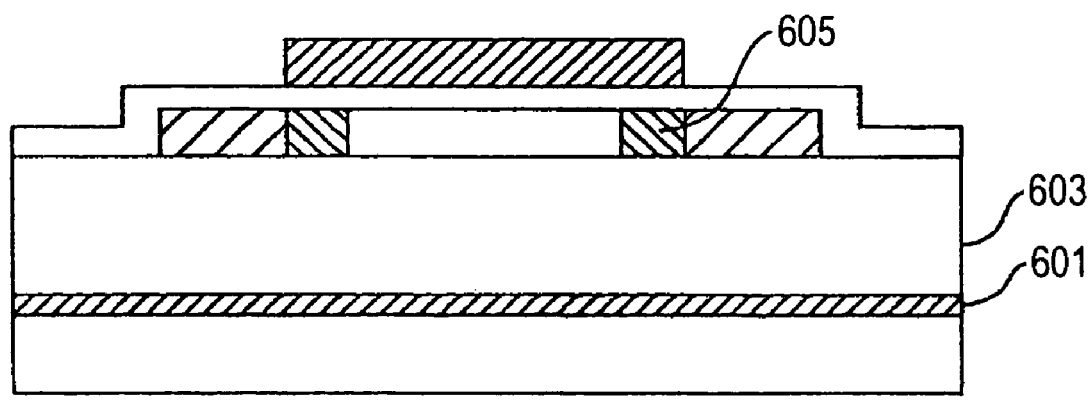

FIGS. 6A and 6B are schematic views illustrating a manufacturing process of a thin film transistor according to the sixth embodiment of the invention.

Referring to FIG. 6A, similarly to the fifth embodiment, after a stacked film including a nitride film 601 and an oxide film 603 is formed on a glass substrate 101 as a base film, a polysilicon layer 103 is formed on the base film. Then, the polysilicon layer 103 is patterned. Subsequently, a gate insulating film 105 and a gate electrode 107 are formed on the polysilicon layer 103. Then, ion-implantation is performed on the polysilicon layer 103. Thus, the source/drain regions are formed. Source/drain regions may be formed by the ion-implantation before the gate insulating film 105 is formed. Thereafter, visible laser light, such as a frequency-doubled YAG laser, is irradiated obliquely from above the glass substrate 101.

Referring to FIG. 6B, similarly to the fifth embodiment, impurities are diffused from the source/drain regions 111 by obliquely irradiating laser light thereto. Thus, LDD regions 605 are formed. Additionally, laser light irradiated obliquely from above the substrate is partly reflected by the stacked film, which includes the oxide film 603 and the nitride film 601 and serves as a transparent base film. The reflected laser light reaches the bottom of a channel of the thin film transistor and contributes to the formed LDD regions 605 under the gate electrode.

As described above, according to the sixth embodiment of the invention, visible laser light, such as the frequency-doubled YAG laser, irradiated from above the glass substrate 101 is partly reflected by the stacked film, which includes the oxide film and the nitride film, and the reflected laser light reaches the bottom of the thin film transistor. Thus, the LDD regions can effectively be formed under the gate electrode.

The nitride film is formed in the base film in this embodiment. However, even in a case where the base film is constituted only by the oxide film, the substrate differs from the base or oxide film in refractive index due to the difference in film quality therebetween. Thus, similar effects can be obtained, thought the degree of effects is low as compared with that of effects obtained in the case where the base film is the stacked film including the oxide film and the nitride film.

Although the thin film transistor, in which the nitride film is formed in the base film, has been exemplified as an embodiment other than the sixth embodiment, this nitride film is not an indispensable constituent. A thin film transistor according to the invention may be configured so that no nitride film is formed in the base film.

Each of the first to sixth embodiments has the glass substrate. The substrate of the thin film transistor according to the invention is not limited thereto. Insulating substrates, such as a plastic substrate, a sapphire substrate, a ceramic substrate, and a quartz substrate, may be employed. Additionally, in the case of the fifth and sixth embodiments, laser light is irradiated from above the substrate. Thus, the substrate is not necessarily a transparent one.

Further, in each of the aforementioned first to sixth embodiments, channel doping for adjusting a threshold voltage of the TFT can be achieved by performing ion-implantation when semiconductor layers are formed by causing the semiconductor layers to include impurities.

Furthermore, although the aforementioned first, second, fourth and sixth embodiments have been described by assuming that the TFTs according to these embodiments are NMOS TFTs, the TFT according to the invention may be configured as a PMOS TFT by changing the type of the impurities.

What is claimed is:

1. A method of manufacturing a thin film transistor, comprising:
    forming a base film, in which one or plural kinds of insulating films are stacked, on a transparent substrate;
    forming a semiconductor layer on the base film;
    forming a gate insulating film on the semiconductor layer;
    forming a gate electrode on the gate insulating film;
    forming source/drain regions by ion-implanting impurity ions into the semiconductor layer; and
    diffusing the impurity ions, which are contained in the semiconductor layer, downwardly from the gate electrode by irradiating laser light, which has a wavelength ranging from 370 nm to 710 nm, from a back surface of the transparent substrate.

2. A method of manufacturing a thin film transistor, comprising:
    forming a base film, in which one or plural kinds of insulating films are stacked, on a substrate;
    forming a semiconductor layer on the base film;
    forming a gate insulating film on the semiconductor layer;
    forming a gate electrode on the gate insulating film;
    forming source/drain regions by ion-implanting impurity ions into the semiconductor layer; and
    diffusing the impurity ions, which are contained in the semiconductor layer, downwardly from the gate electrode by irradiating laser light, which has a wavelength ranging from 370 nm to 710 nm, obliquely from above while the substrate is rotated.

3. The method of manufacturing a thin film transistor according to claim 2, wherein:
    the forming of the base film includes:
        forming a nitride film on the substrate; and
        forming an oxide film on the nitride film; and
    the laser light is irradiated to a region under a channel of the thin film transistor by being reflected by an interface between the nitride film and the oxide film due to difference in refractive index therebetween.

4. The method of manufacturing a thin film transistor according to claim 1, wherein
    plural ion species differing in diffusion coefficient from one another are used as the impurity ions.

5. The method of manufacturing a thin film transistor according to claim 1, wherein
    the impurity ions are implanted obliquely into the semiconductor layer while the substrate is rotated.

* * * * *